United States Patent [19]

Nikaido

[11] Patent Number: 4,791,031
[45] Date of Patent: Dec. 13, 1988

[54] LEAD FRAME FOR IC HAVING A WIRE BONDING PART COMPOSED OF MULTI-LAYER STRUCTURE OF IRON CONTAINING ALLOY, REFRACTORY METAL AND ALUMINUM

[75] Inventor: Hideyasu Nikaido, Tokyo, Japan

[73] Assignee: Sumitomo Metal Mining Co. Ltd., Tokyo, Japan

[21] Appl. No.: 113,661

[22] Filed: Oct. 28, 1987

[30] Foreign Application Priority Data

Oct. 29, 1986 [JP] Japan ................................. 61-255903

[51] Int. Cl.$^4$ ............................................. H01L 21/285
[52] U.S. Cl. ........................... 428/620; 148/DIG. 140; 437/192; 437/194; 437/220
[58] Field of Search ........................ 437/192, 194, 220; 428/620

[56] References Cited

U.S. PATENT DOCUMENTS

| | | | |
|---|---|---|---|
| 4,086,375 | 4/1978 | La Chapelle et al. | 437/220 |
| 4,463,059 | 7/1984 | Bhattacharya et al. | 428/620 |
| 4,478,881 | 10/1984 | Bartur et al. | 427/90 |
| 4,495,222 | 1/1985 | Anderson et al. | 437/192 |
| 4,507,852 | 4/1985 | Karulkar | 437/192 |
| 4,604,291 | 8/1986 | Huang et al. | 427/37 |
| 4,673,623 | 6/1987 | Gardner et al. | 428/620 |
| 4,680,612 | 7/1987 | Hieber et al. | 428/620 |

FOREIGN PATENT DOCUMENTS

| | | | |
|---|---|---|---|
| 0110089 | 10/1978 | Japan | 437/192 |
| 0115221 | 6/1985 | Japan | 437/192 |
| 2138633A | 10/1984 | United Kingdom | 437/220 |

*Primary Examiner*—Upendra Roy
*Attorney, Agent, or Firm*—Watson, Cole, Grindle & Watson

[57] ABSTRACT

In a lead frame for an IC which is provided on a wire bonding part of the inner lead unit thereof with an aluminum coating, possible detrimental diffusion of the component elements of the lead frame into the aluminum coating can be effectively precluded by having a layer of a high melting point metal interposed between the lead substrate and the aluminum coating in the wire bonding part without appreciably increasing the cost of production.

5 Claims, No Drawings

LEAD FRAME FOR IC HAVING A WIRE BONDING PART COMPOSED OF MULTI-LAYER STRUCTURE OF IRON CONTAINING ALLOY, REFRACTORY METAL AND ALUMINUM

BACKGROUND OF THE INVENTION

1. Field of the Invention

This invention relates to a lead frame for an IC which is provided in the inner lead unit thereof with an aluminum coating.

2. Description of the Prior Art

Among the existing packaging systems for semiconductor integrated circuit (IC) elements is counted the ceramic package introduced by U.S. Pat. No. 4,604,291. This package is produced by preparing a ceramic substrate possessing at the center thereof a depression for accommodating a given IC element, fusing a lead frame made of a copper alloy or an iron-nickel alloy with low melting point glass to the ceramic substrate, separately preparing a ceramic lid having similar low melting point glass fused thereon so as to be paired with the ceramic substrate, fixing the IC element in the depression of the substrate, connecting the electrodes on the IC element to the metal coating of an inner lead unit of a lead frame through the medium of fine metallic wires, mounting the lid on the substrate, and heating the substrate and the lid jointly, thereby sealing the gap therebetween in an air tight manner. Since this package has a highly satisfactory property of radiating heat, it finds utility in IC's of relatively high-power and high-speed.

Particularly where the package is required to operate with high reliability and the electrodes on the IC element are made of aluminum (Al), the practice of forming the fine metallic wires with Al and also forming the metallic coating on the wire bonding part of the inner lead unit of the lead frame with Al is generally followed.

One of the various versions of the packaging system described above necessitates an extra step of folding an external lead unit after completion of a package. If the seal glass used in this package has a low melting point, the possibility arises that the glass layer will sustain a crack during the folding of the external lead unit and the package will consequently lose airtightness. To preclude this trouble in the production of an IC device which requires this folding step after completion of packaging, the practice of using seal glass of high strength has been gaining in popularity. Since this glass has a high melting point, the work of fusing the substrate with the lead frame must be carried out at a temperature in the range of 500° to 530° C., a level representing an increase of about 100° C. over the temperature prevalent in the production using the conventional low melting point glass. When the fusion of the lead frame is carried out at this elevated temperature, Cu, Fe, Ni, etc., which are component elements of the lead frame, are caused to diffuse and reach the surface of the lead frame and impair the connection of Al wires and jeopardize the fastness of their joint so long as the Al coating has a thickness in the conventional range of 2 to 2.5μ. This drawback is tentatively overcome by increasing the thickness of the Al coating to at least twice the conventional magnitude. This increase in the thickness of the Al coating inevitably results in a proportionate increase in the time required for the work of fusion and in the cost of production as well. Under the circumstances, the desirability of seeking a drastic solution to the problem has been finding growing recognition.

In the light of the true state of affairs described above, the present invention aims to provide a lead frame for an IC which is enabled to give effective prevention of the component elements of the lead frame thereof from being diffused in the Al coating and which can be manufactured at a low cost.

SUMMARY OF THE INVENTION

To attain the object described above, the lead frame of the present invention is characterized by having a layer of a high melting point metal interposed between the lead frame substrate and the Al coating in the wire bonding part thereof.

The term "high melting point metal" as used in this invention refers to a metal possessing a melting point of not less than 1700° C. Examples of a metal meeting this description, include Pt (1,774° C.), Ti (1,800° C.), Cr (1,905° C.), Nb (2,415° C.), Mo (2,620° C.), and Ta (2,996° C.). The layer of this high melting point metal is interposed between the lead substrate and the Al coating for the purpose of preventing Cu (1,083° C.), Fe (1,535° C.), Ni (1,455° C.), etc., from being diffused out of the lead substrate. The effect of the interposed layer increases in proportion as the melting point of the metal used for the interposed layer increases. The metal selected for the interposed layer is desired to have a high melting point as described above further for the purpose of preventing the metal in the interposed layer from being diffused into the Al coating. If the metal so selected has an excessively high melting point, then it is not easily molded in the form of a layer. It is, therefore, proper to select the metal from among Ti, Cr, Nb, and Mo. The molding of the high melting point metal in the form of a layer may be effected by means of vapor deposition, sputtering, or ion plating. From the standpoint of fastness of adhesion, however, the ion plating proves to be particularly desirable.

As described above, the effect brought about in curbing the diffusion increases in proportion to the melting point of the selected metal. It has been experimentally ascertained that Mo is most suitable in the four metals mentioned above and is capable of manifesting the effect of curbing the diffusion with a layer thickness of about 100 Å as compared with Ti which requires a layer thickness of about 1μ for producing the same effect. The thickness which the layer of the aforementioned metal requires to possess for the purpose of preventing the component metals of the lead substrate from diffusing and reaching the surface of the layer within the span of time required for fusion of the lead frame is several hundred Å for Mo and about 2μ for Ti. When the layer has this thickness, the thickness of the Al coating can be decreased to the minimum magnitude of about 6,000 Å required for wire bonding. By giving a thickness in the range of one to several hundred Å to the layer of Mo or a thickness in the range of 1 to 2μ to the layer of Ti, for example, the thickness of the Al coating can be decreased to a level in the range of 0.6 to 2.5μ, a magnitude of not more than one half of the conventional magnitude.

The Al coating can similarly be formed by a dry plating technique such as vapor deposition, sputtering, or ion plating. From the standpoint of fastness of adhesion and hardness of the produced coat, the arc discharge type ion plating proves to be particularly desirable. By the arc discharge type ion plating, the Al coating is obtained in a very supple texture befitting the wire bonding.

(EXAMPLE)

On plates of a Fe-Ni alloy consisting of 58% by weight of Fe and 42% by weight of Ni, Ti and Mo were deposited by the arc discharge type ion plating technique each in varying thicknesses, 100 Å, 1,000 Å, 1μ, and 2μ. The coated Fe-Ni alloy plates were heated in air at 500° C. for 10 minutes. After the heating, the surfaces of the Ti and Mo layers were visually inspected. The results are shown in Table 1. In Table 1, each circle (○) denotes a sample which assumed a silvery white color proper to Ti and Mo, each triangle (Δ) a sample which assumed a light blue color, and each cross (X) a sample which assumed a blue color. Since the blue color is assumed when Fe-Ni is oxidized, the density of blue white color serves as the scale for measuring the amount of Ni which reached the surface of sample.

TABLE 1

| Thickness of layer | Ti | Mo |
|---|---|---|
| 100Å | X | Δ |
| 1,000Å | X | ○ |
| 1μ | Δ | ○ |
| 2μ | ○ | ○ |

It is noted from the results of Table 1 that the layer of Mo could substantially prevent the advance of diffusion of Ni and Fe by its own surface when the thickness thereof was about 100 Å, whereas the layer of Ti required a thickness of about 1μ to effect similar prevention. It is also noted that the layer of Mo did not allow the advance of diffusion of Ni and Fe to reach its own surface when the thickness thereof was 1,000 Å, whereas the layer of Ti had to possess a thickness of only 2μ to effect the prevention sufficiently. From the results, it can be safely concluded that the Al coating is allowed to retain the conventional thickness when the layer of Mo has a thickness in the range of one to several hundred Å and that of Ti in the range of 1 to 2μ.

This invention is not limited to the working example cited above but may be practised otherwise without departing from the spirit of the invention disclosed herein.

According to the construction of this invention, the lead frame can be offered at a lower cost because the Al coating is allowed to have a smaller thickness in fulfilling its function thoroughly.

What is claimed is:

1. A lead frame for a semiconductor integrated circuit device which includes an inner lead unit that has a wire bonding part and is composed of an iron-containing alloy, a layer of a metal having a melting point of at least 1700° C. on said wire bonding part of said inner lead unit, and a coating of aluminum on said layer of metal; said layer of metal reducing diffusion of metals from said inner lead frame to said coating of aluminum when subjected to elevated temperatures of at least 500° C.

2. The lead frame according to claim 1, wherein said metal is selected from the group consisting of Ti, Cr, Nb, and Mo.

3. The lead frame according to claim 1, wherein said layer of metal is formed by vacuum deposition, sputtering, or ion plating.

4. The lead frame according to claim 1, wherein said aluminum coating is formed by vapor deposition, sputtering, or ion plating.

5. The lead frame according to claim 1, wherein said aluminum coating possesses a thickness of at least 6,000 Å.

* * * * *